United States Patent
Harrison et al.

(10) Patent No.: US 7,548,071 B2
(45) Date of Patent: Jun. 16, 2009

(54) REFLECTOMETRY TEST SYSTEM USING A SLIDING PSEUDO-NOISE REFERENCE

(75) Inventors: Reid Harrison, Salt Lake City, UT (US); Cynthia Furse, Salt Lake City, UT (US); Chirag Sharma, Palo Alto, CA (US)

(73) Assignee: University of Utah Research Foundation, Salt Lake City, UT (US)

( * ) Notice: Subject to any disclaimer, the term of this patent is extended or adjusted under 35 U.S.C. 154(b) by 333 days.

(21) Appl. No.: 11/700,728

(22) Filed: Jan. 30, 2007

(65) Prior Publication Data

US 2007/0194796 A1 Aug. 23, 2007

Related U.S. Application Data

(60) Provisional application No. 60/764,136, filed on Jan. 31, 2006.

(51) Int. Cl.
*G01R 31/11* (2006.01)
*G01R 27/28* (2006.01)
*G01R 23/16* (2006.01)

(52) U.S. Cl. .................. 324/617; 324/533; 324/534

(58) Field of Classification Search ............ 324/617, 324/642, 533, 543
See application file for complete search history.

(56) References Cited

U.S. PATENT DOCUMENTS

| | | | |
|---|---|---|---|
| 4,744,083 A | 5/1988 | O'Neill et al. | |
| 4,789,948 A | 12/1988 | Von der Embse | |
| 5,000,568 A | 3/1991 | Trutna, Jr. et al. | |
| 5,731,993 A | 3/1998 | Wachs et al. | |
| 6,144,721 A | 11/2000 | Stephens | |
| 6,462,705 B1 | 10/2002 | McEwan | |
| 6,509,740 B1 | 1/2003 | Needle et al. | |
| 6,836,517 B2 * | 12/2004 | Nagatani et al. | 375/296 |
| 6,842,011 B1 * | 1/2005 | Page et al. | 324/637 |
| 7,165,200 B2 * | 1/2007 | Jani et al. | 714/724 |
| 7,250,772 B2 * | 7/2007 | Furse et al. | 324/534 |
| 7,375,602 B2 * | 5/2008 | Flake et al. | 333/20 |

(Continued)

FOREIGN PATENT DOCUMENTS

WO  WO 0225299  3/2002

OTHER PUBLICATIONS

TaylorF. et al., "Digital simulation of fault location on EHV lines using wideband spread spectrum techniques," Generation, Transmission and Distribution, IEE Proceeding, Jan. 1995, pp. 73-80, vol. 142, No. 1.

(Continued)

*Primary Examiner*—Timothy J Dole
*Assistant Examiner*—John Zhu
(74) *Attorney, Agent, or Firm*—Kirton & McConkie; William T. Ralston

(57) ABSTRACT

A technique for reflectometry testing of a signal path is disclosed. The technique includes injecting a test signal based on a probe pseudo-noise sequence into the signal path and obtaining a response signal. A sliding reference pseudo-noise sequence is correlated against the response signal. Both the probe sequence and the reference sequence are generated at a chip rate. The correlation is obtained for integer chip time delays, and sub-chip resolution of a peak correlation delay is estimated from at least two samples of the correlation.

30 Claims, 9 Drawing Sheets

U.S. PATENT DOCUMENTS

2002/0161539 A1 10/2002 Jones et al.
2002/0161542 A1 10/2002 Jones et al.
2002/0169585 A1 11/2002 Jones et al.
2003/0185101 A1 10/2003 Wildey
2004/0019443 A1 1/2004 Jones et al.
2004/0039976 A1 2/2004 Gunther et al.

OTHER PUBLICATIONS

TaylorF. et al., "Line monitoring and fault location using spread spectrum on power line carrier" Generation, Transmission and Distribution, IEE Proceeding, Sep. 1996, pp. 427-434, vol. 143 No. 5.

* cited by examiner

REFLECTOMETRY TEST SYSTEM USING A SLIDING PSEUDO-NOISE REFERENCE

This application claims the benefit of U.S. Provisional Patent Application No. 60/764,136, filed on Jan. 31, 2006, and entitled "Reflectometry test system using a sliding pseudo-noise reference" which is herein incorporated by reference.

This invention was made with government support under Grant #CMS0330465-1 awarded by the National Science Foundation and Award #FA8650-04-C-5228 awarded by the United States Air Force. The Government has certain rights to this invention.

BACKGROUND OF THE INVENTION

1. Field of the Invention

The present invention relates generally to the field of electronic system testing.

2. Related Art

Electronic systems are ubiquitous. An essential component of these systems is their internal signal paths, most typically provided by wired interconnects. Failures in the wiring frequently result in failure of the system. For example, aging wiring in buildings, aircraft and transportation systems, consumer products, industrial machinery, and the like is among the most significant potential causes of catastrophic failure and maintenance cost in these structures. High profile airline crashes attributed to aging wiring have brought the need for improved wire testing systems to the forefront of industry attention.

Various techniques for the characterization and fault detection of electronic signal paths are known. For example, techniques such as time domain reflectometry (TDR), frequency domain reflectometry (FDR), and sequence time domain reflectometry (STDR) can be used to determine where a short or break in a wire has occurred. More recently, improvements such as spectral time domain reflectometry (STRDR) and spread spectrum time domain reflectometry (SSTDR) have been developed to allow testing of a wire while operational signals are present. Common to all of these techniques is the injection of a reflectometry test signal into the wire to be tested, and observation of the response. As the test signal propagates from the test instrument, impedance mismatches in the wire generate reflections that propagate back to the test instrument. Impedance mismatches can be caused by a variety of things, including for example, breaks in the wire, short circuits, branches, and wire gauge changes. The resulting response can be analyzed to determine features of the wire, such as distance to an open or short circuit.

Traditionally, reflectometry instruments have been relatively bulky. For some instruments, part of the bulk is driven by the inclusion of an operator display that can be visually interpreted. Other instruments are relatively large, because line current power supplies to operate the equipment are included. Generally, reflectometry has been a form of off-line testing, since on-line live testing was not practical due to the size, cost, and power requirements of existing instruments. Furthermore, live testing has been avoided because the test signal may interfere with the existing power and/or signals on the line, and vice versa. Unfortunately, certain types of failures, such as intermittent open or short circuits, are difficult to detect off-line, since the conditions causing the failure are often not present during off-line testing.

SUMMARY OF THE INVENTION

It has been recognized that it would be advantageous to develop a reflectometry system and method that is suitable for low power and/or integrated circuit implementations.

One embodiment of the invention is a system for reflectometry testing of a signal path. The system includes a means for generating a probe sequence and a reference sequence, each generated at a chip rate. The probe sequence is a pseudo-noise sequence that repeats every L chip times, and the reference sequence is a pseudo noise sequence that repeats every L+1 chip times. The probe sequence is equal to the pseudo-noise sequence over a continuous segment of length L chips. The system includes means for injecting the probe sequence into the signal path and means for obtaining a response from the signal path. The system also includes means for correlating the response of the signal path with the reference sequence to obtain a correlation function. The correlation function is provided in the form of a plurality of samples, where each sample is a sample of the correlation function at an integer chip time delay. Finally, the system includes means for estimating a time delay corresponding to a peak of the correlation function. The time delay has an integer chip number portion and a fractional chip number portion. Accordingly, the time delay provides sub-chip time resolution.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

FIGS. 9-12 are graph showing simulated and measured correlation results for the operation of a reflectometer for various delays, in accordance with an embodiment of the present invention;

DETAILED DESCRIPTION

Figure 1:
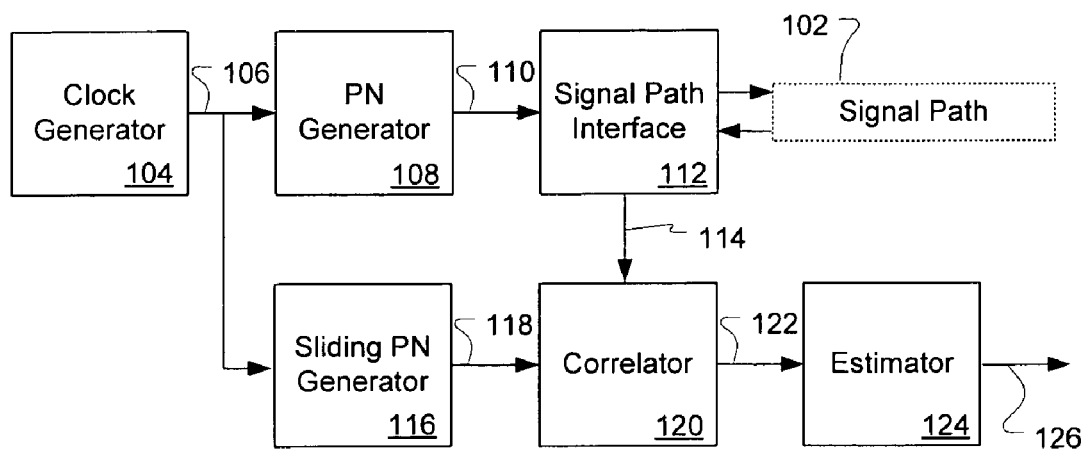
FIG. 1 is block diagram of a system for reflectometry testing of a signal path in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As illustrated in FIG. 1, a system 100 for reflectometry testing of a signal path is shown in accordance with an embodiment of the present invention. The system can be used for reflectometry testing of a signal path 102. If desired, this testing can be performed when an operational signal is present on the signal path. By operational signal is meant a signal which is part of an operational system which includes the signal path under test. For example, the operational system may be an aircraft and the signal path a wire within the aircraft. Various types of operational signals are present in systems, including power supply signals, digital signals, analog signals, etc.

The system 100 includes a system clock 104 that generates a clock 106 at a chip rate, R. The system also includes a means for generating a probe sequence at the chip rate, for example a pseudo-noise generator 108. The pseudo-noise generator is coupled to the system clock and outputs a probe sequence 110 of pseudo-random chips that is L chips long. The probe sequence repeats every L chip times.

The system 100 also includes a means for injecting the probe sequence into a signal path and obtaining a response of the signal path to the probe sequence. For example, a signal path interface 112, described in further detail below, can inject the probe sequence 110 into the signal path and extract the response signal 114

A means for generating a reference sequence is also included, for example a sliding pseudo-noise generator 116. The sliding pseudo-noise generator generates a reference sequence 118, also at the chip rate. The reference sequence is equal to the probe sequence over a length L, but is L+1 chips long. The extra chip can be an arbitrary value, for example, either a 1 or a 0 in a binary system. Hence, the reference sequence will slide by 1 chip time relative to the probe sequence every L chip time intervals. In other words, the reference sequence shifts by one chip time delay each repeat.

The reference sequence thus lags the probe sequence, with the lag increasing with every repeat of the sequence. This allows correlation of the reference sequence with the response signal over a range of time delays. For example, a sample of the correlation can be obtained by integrating over each interval of L chips of the reference sequence, as described further below. After L intervals, samples of the correlation function have been obtained for all L possible time shifts.

A means for estimating a correlation of the reference signal 118 with the response signal 114, e.g. a correlator 120, provides samples of the correlation function 112. Correlation is performed over L chips of the reference sequence, and samples of the correlation function are output at intervals of L+1 chip times A correlation function sample can be obtained for each one chip shift of the reference sequence. Hence, a sequence of L samples provides a complete set of samples of the correlation function of the response signal over the delay range of $\{0, T_c, 2T_c, 3T_c, \ldots, (L-1)T_c\}$, where $T_c$ is the chip time, $T_c=1/R$. In some applications, only some of the correlation samples may be needed, so the entire set of L samples need not be calculated. For example, the shape of the correlation function may be estimated based on a few of the correlation samples. Various ways of estimating the correlation function can be used, as discussed in further detail below.

Operation of the system can be described mathematically. The reference signal can be represented by s(t). The response signal can be represented by s'(t). The response signal may be, for example a scaled and time delayed copy of the transmitted signal s(t). The response signal s'(t) will return to the test system after some transmission delay. The cross-correlation function of the transmitted sequence s(t) and the reflected sequence s'(t) is a function of the delay of the reflected sequence and can be written as $$R_{ss'}(\tau) = \frac{1}{T}\int_0^T s'(t)s(t+\tau)$$

where this operation will be recognized to those of skill in the art as one way of estimating the correlation function.

It will be appreciated that the cross-correlation function ($R_{SS'}(\tau)$) is a maximum at the instant when both s'(t) and the time shifted copy of s(t) are perfectly aligned with each other (i.e., $\tau$ is equal to the delay of the reflected signal s'(t)). This delay ($\tau$) of the reflected signal can be translated into the distance to the fault (d) by the following relationship $2d=v_{prop}\tau$ where '$\tau$' is the delay of the reflected PN sequence, $v_{prop}$ is the velocity of propagation on the cable, and d is the distance to the fault.

Completing the description of system 100, a means for estimating a time delay, e.g. an estimator 124, is coupled to the correlator and estimates a peak correlation delay time 126 from at least two samples of the correlation. The peak correlation delay time includes an integer portion, corresponding to the integer number of chip times, and a fractional portion, corresponding to a fraction portion of a chip time. In other words, if the peak correlation delay is determined to be at a delay time of $4.5T_c$, the integer portion is 4 and the fractional portion is 0.5.

Because the estimator 124, described in further detail below, allows determining a fractional portion of the delay time, sub-chip resolution of the delay can be obtained. This provides several benefits. One benefit is that the all of the components of the system 100 may be operated at a clock rate equal or less than the chip rate. This is in contrast to prior systems that operate components at multiples of the clock rate to provide higher resolution. Lower clock rates are desirable in integrated circuit implementations, since lower clock rates translate into lower power consumption and lower heat dissipation.

In one embodiment, a single chip implementation of the system 100 can be obtained by incorporating the pseudo-noise generator 108, sliding pseudo-noise generator 116, correlator 120, and estimator 124 into a monolithic integrated circuit. The system clock 104 can be provided from an external source, or the system clock can also be included on the integrated circuit. For example, a mixed signal (analog and digital) process can be used to implement a complete system on a chip, as illustrated by one exemplary embodiment described further below.

Detailed implementation of various components of the system 100 will now be provided, in accordance with embodiments of the present invention. The pseudo-noise generator 108 and sliding pseudo-noise generator 116 can be efficiently implemented in digital logic in the form of a linear feedback shift register. For example, the pseudo-noise sequence can be a maximum length (ML) sequence. It is desirable that the pseudo-noise sequence have good autocorrelation properties, by which is meant that the autocorrelation function provides a single, well-defined peak. Of course, the pseudo-noise sequence need not be perfect, as deviations from a single, well-defined peak in the autocorrelation, such as correlation sidelobes may occur. The acceptable level of correlation sidelobes will depend on the application and accuracy desired. Various linear feedback shift register techniques are known and will not be discussed further. Alternately, other types of pseudo-noise codes can be used as will occur to one skilled in the art.

As a specific example, the pseudo-noise sequence can be a recursive linear sequence described as follows. Let $b_n$ be a recursive linear sequence of period K consisting of 1's and 0's. Let $a_n$ be a recursive linear sequence consisting of 1's and −1's such that, $a_n = 2 \cdot b_n - 1$. Then let $$s(t) = \sum_{n=-\infty}^{n=\infty} a_n \cdot p(t - nT_c)$$

where $$p(t) = \begin{cases} 1 & 0 \le t \le T_c \\ 0 & \text{otherwise} \end{cases}$$

so that s(t) is a Recursive Linear Signal (RLS) of period $T = KT_c$ consisting of 1's and −1's. Here, $T_c$ is the minimum time step of 1 or −1, otherwise known as a "chip." Note that s(t)=s(t+T) for a RLS of period T.

The pseudo-noise generator 108 and sliding pseudo-noise generator 116 can have the same structure. The sliding pseudo-noise sequence can be generated by clocking the sliding pseudo-noise generator by the system clock, but omitting every $L+1^{th}$ clock. Various other equivalent implementations will occur to one skilled in the art.

One benefit of using a sliding pseudo-noise reference sequence is that delay lines can be avoided. For example, some previous reflectometry systems require a variable delay element. Variable delays can be difficult to implement in analog format, and it can be difficult to accurately control the delay. For example, when implemented using analog devices, the delay is often sensitive to temperature or process variations. While digitally implemented delays are more controllable, digital delay lines may not provide delay times with finer resolution than the clock rate. Accordingly, prior digital reflectometry implementations have generally included high rate clocks (multiples of the chip rate) to provide high resolution. Higher clock rates can increase power consumption and cost of circuit implementations. In contrast, in embodiments of the present invention, the sliding pseudo-noise generator 116 can run at the same clock rate as the pseudo-noise generator 108, helping to avoid a need for high rate clocks and eliminating the need for a delay line. Delay generation is thus precise, as the reference sequence is delayed in discrete, one clock increments, which can be carefully controlled. Instead of using high rate clocks, various techniques are used by the estimator 124 to efficiently provide sub-chip resolution.

Various ways of interfacing to the signal path 102 can be used. As one alternative, the signal path interface 112 can include a signal injection portion and a signal extraction portion. For example, the probe sequence 110 can be injected into the signal path using one port of a directional coupler, and the response signal 114 extracted using a second port of the directional coupler.

Various types of signal couplers for injection/extraction can be used. For example, a signal coupler can be a direct wire connection. Alternately, a signal coupler can inject or extract signals through a series connected capacitor or a series connected inductor. For example, commonly-owned co-pending U.S. patent application Ser. No. 11/543,245 (which claims the benefit of and incorporates U.S. Provisional Patent Application Ser. No. 60/723,545), entitled "Non-Contact Reflectometry System and Method," herein incorporated by reference, discloses various types of capacitive couplers which can be used with the system 100. A capacitive coupler can be beneficial in helping to protect the system from high-voltage signals present on the signal path. A capacitive coupler can also help to provide a high impedance coupling to the signal path to minimize coupling-induced reflections.

Live testing may be performed when an operational signal is present in the signal path 102, although testing can be performed when the signal path is not operational as well. In live testing, the injected probe sequence 110 will be superimposed on the operational signal. Similarly, the operational signal will be superimposed on the extracted response signal 114. By maintaining the level of the injected probe sequence below system noise margins, the operational signal may be left largely unaffected as the injected probe sequence appears as a small additional amount of noise.

Figure 2:
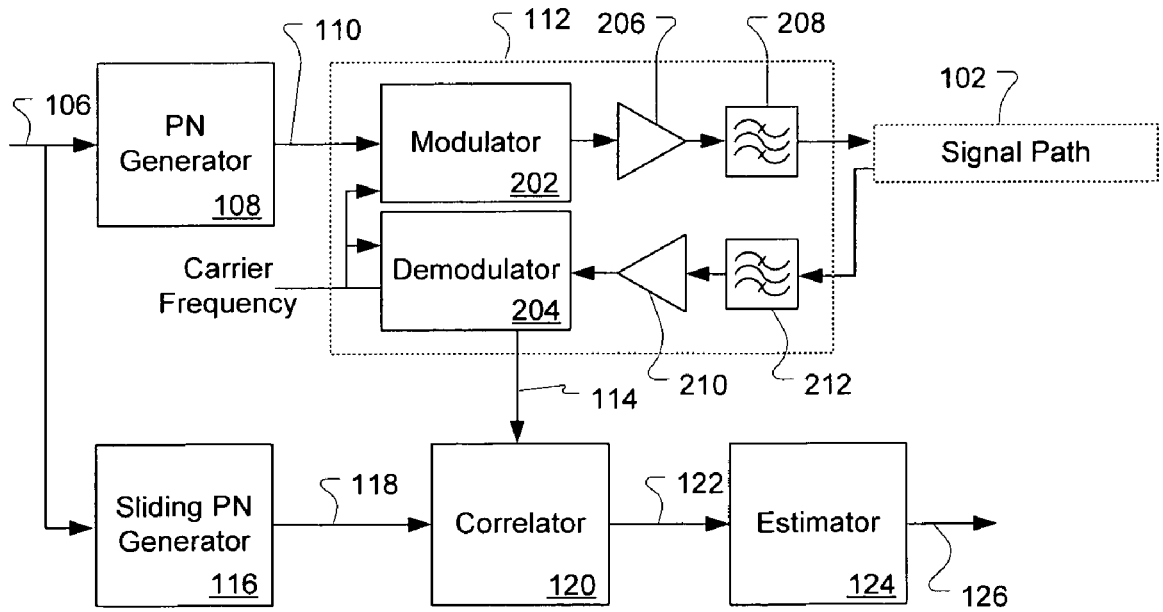
FIG. 2 is a block diagram of a system for reflectometry testing of a signal path in accordance with an embodiment of the present invention.

Depending on the type of signal path being tested, injection of the probe sequence directly into the signal path may be undesirable, for example, due to interference that the probe sequence may cause to the operational signal and vice versa. In such a situation, operation may be enhanced by translating the probe sequence to a carrier frequency before injection into the signal path. Accordingly, as illustrated in FIG. 2, the signal path interface 112 can also include a modulator 202 to modulate (frequency-translate) the probe pseudo-noise sequence onto a carrier frequency before injection into the signal path. The signal path interface can also include a demodulator 204 to demodulate the response signal (i.e., undo the frequency translation) before correlation with the reference pseudo-noise sequence 118.

Figure 3:
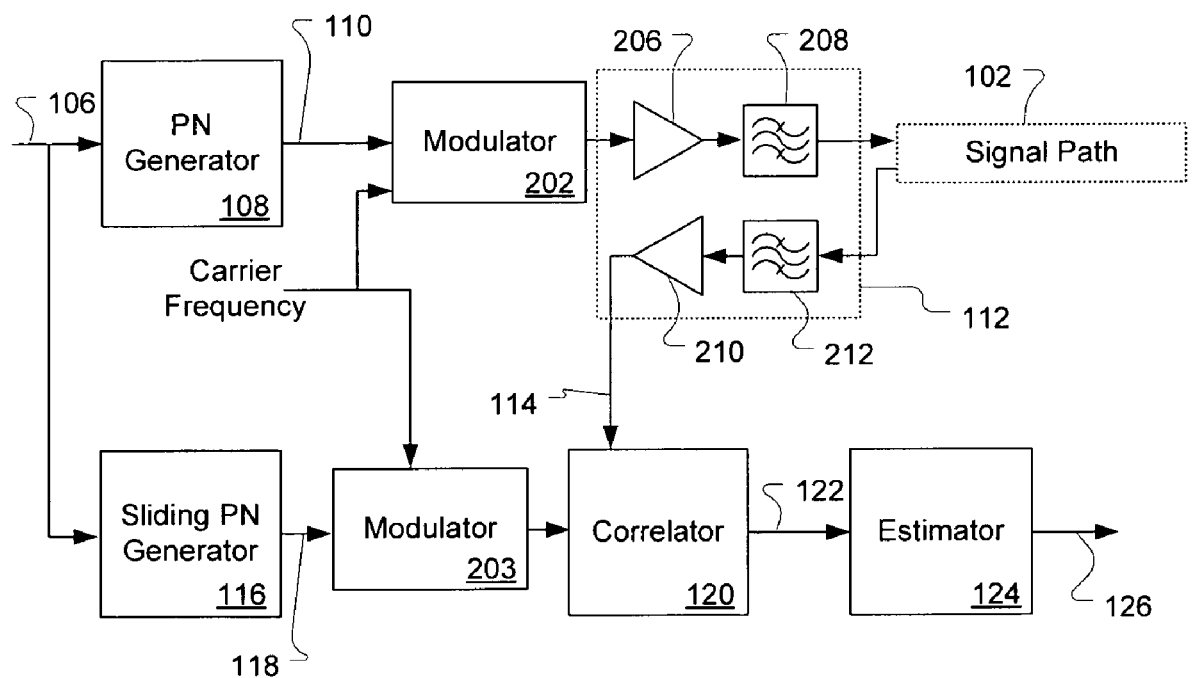
FIG. 3 is a block diagram of a system for reflectometry testing of a signal path in accordance with an embodiment of the present invention.

As an alternative, as illustrated in FIG. 3, rather than the signal path interface including a demodulator, the sliding pseudo-noise generator 116 can include a modulator 203 to modulate the reference pseudo-noise sequence onto the carrier frequency. In general, the correlation may be done at baseband (no frequency-translation), a carrier frequency, or an intermediate frequency (by including additional modulators/demodulators).

Other modifications of the injected and extracted signals in addition to (or in place of) frequency translation can prove helpful depending on the application. For example, as shown in FIGS. 2 and 3, the probe sequence may be amplified, attenuated, or filtered, e.g. by amplifier 206 and filter 208. It may prove helpful to filter the probe sequence to help reduce interference to the operational signal, or to improve the correlation properties of the sequence. Similarly, the response signal may be passed through an amplifier 210, attenuator, and/or filter 212. Various components for performing these functions can be used.

Turning to the correlator 120, various implementations may be used. For example, in an embodiment, the correlator can be implemented in digital circuitry, using a multiplier and a summer or using a multiplier and an integrator. As another example, digital matched filters can be used to implement the correlator. As another exemplary embodiment, the correlator can be implemented in analog circuitry, using a mixer and an integrator or using a mixer and an analog filter. The correlator need to produce the exact correlation, but can provide an estimate or approximation of the correlation.

As a specific exemplary embodiment, a Gilbert-cell mixer and Gm-C filter can be used to provide a space efficient implementation of a correlator suitable for a mixed-signal semiconductor process, as described below. As yet another example, a passive RC filter can be used, or various other filter implementations can be used.

The estimator 124 helps to avoid clocks at multiples of the chip rate by determining one or more delay time values with sub-chip time resolution. Multiple delay values may be determined when the correlation values have several local extrema (minimums or maximums). For example, multiple correlation peaks can occur when there are multiple reflections from mismatches in the signal path under test. The time delay of each correlation peak corresponds to the round trip delay to the mismatch causing the corresponding reflection. Hence, the estimator may be configured to determine a plurality of time delays corresponding to multiple local extrema of the correlation values. Estimating the delay time for each peak can proceed similarly.

Local extrema can be either positive or negative. For example, a short circuit results in a reflection that is inverted from the injected signal, and thus the correlation result will be negative. In contrast, an open circuit results in a reflection equal to the injected signal for an ideal line (attenuated and possibly filtered by a non-ideal line), and thus the correlation result will be positive.

The delay time of a correlation peak will generally not be an integer multiple of the chip time. Hence, a local extremum, being at an integer multiple of the chip time, will rarely be aligned with the correlation peak, that may be between two samples of the correlation. While rough estimates of the delay time can be obtained based on the chip time resolution, such results may not achieve the desired accuracy without using very high chip rates. For example, a chip time of 10 ns translates into a distance of about 3 feet (using $v_{prop}=2 \times 10^8$ m/s). To obtain resolution of 1 foot can be obtained by reducing the chip time to about 3 ns, or using three-times the clock rate. Power consumed by digital circuitry is directly proportional to the clock frequency, so this may be undesirable. In contrast, sub-chip resolution can be provided using the estimator 124 to provide improved accuracy without increasing the chip rate as will now be explained.

Theoretically, the shape of the correlation peak can be known. The shape is a function of a number of factors, including the autocorrelation of the pseudo-noise sequence, the pulse shape of the probe and reference sequences, characteristics of modulation and demodulation( if used), and frequency response characteristics of the signal path. For example, for a perfectly rectangular pseudo-noise sequence with an ideal autocorrelation, the correlation is a triangle function exactly two chip-times wide. Hence, the estimator can determine where between samples the correlation peak falls by using an interpolator matched to the correlation pulse shape.

For example, sub-chip time resolution can be obtained by using a plurality of correlation pattern templates that correspond to different fractional chip delays. Two (or more) of the correlation samples can be compared to the templates to determine which fractional chip delay most closely matches. This comparison can be done in various ways, including for example, measuring mean square error between the correlation samples and the template.

An alternate approach is to interpolate the fractional chip delay portion from the locally maximum correlation value and one or more adjacent correlation values. For example, linear interpolation can be performed using the locally maximum correlation value and the larger of the adjacent correlation values as will now be described mathematically.

Define the local extremum as $x_m$ where $\{x_i\}$ are the correlation samples at delay times $iT_c$, $0<i<L-1$, and m is the integer chip time delay corresponding to the local extremum value. Find the larger correlation value $x_n$ of the immediately adjacent correlation values $x_{m+1}$ and $x_{m-1}$. The fractional time delay is thus given by $m+((x_n/x_m)/(1+x_n/x_m))$ when $x_{m+1}>x_{m-1}$; and $m-((x_n/x_m)/(1+x_n/x_m))$ when $x_{m+1}<x_{m-1}$. This linear interpolation scheme is relatively simple and thus easily implemented using a microcontroller. Various other interpolation schemes will occur to one skilled in the art in possession of this disclosure.

Alternate implementations of the system 100 are also possible. For example, many of the components can be implemented in software executing on a microprocessor or digital signal processor. For example, techniques for efficient software implementation of linear feedback shift register sequences are known that can be used. Similarly, an efficient correlator can be implemented by processors which include single cycle multiply-accumulate instructions. Note that the multiply-accumulate can be performed at the chip rate, hence a high speed processor may not be required.

Figure 4:
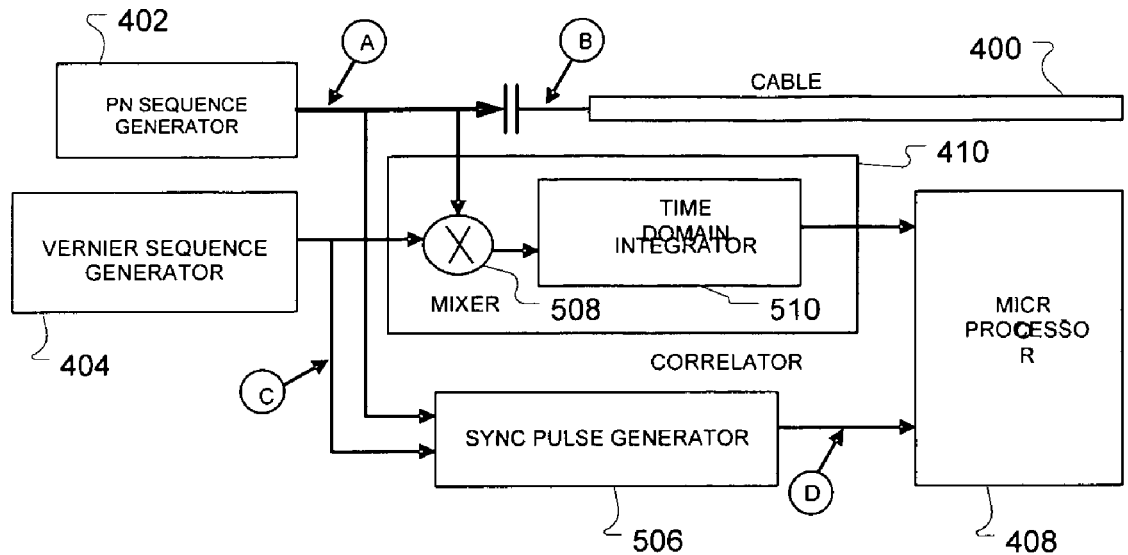
FIG. 4 is a block diagram of an integrated circuit chip implementation of a reflectometer in accordance with an embodiment of the present invention.

An integrated circuit implementation of an exemplary reflectometry system was fabricated using a mixed-signal commercially-available 3-metal, 2-poly 0.5-µm CMOS process. The integrated circuit chip uses both digital and analog components in its operation. FIG. 4 is an overall block diagram of the chip in use to test a signal path (cable) 400. The probe sequence is provided by a PN sequence generator 402, and the reference sequence is provided by a "Vernier" sequence generator 404. The term "Vernier" is used as an allusion to the "Vernier Scale" known in the mechanical arts. A Vernier scale is a sliding secondary scale (e.g. on calipers) that allows one read measurement values more precisely from an evenly divided primary measurement scale to provide resolution greater than the primary measurement scale alone. The Vernier sequence generator provides a somewhat similar function, as it allows more precise estimate of the time of peaks in the correlation function, providing finer time resolution than the basic chip time interval of the PN sequence generator.

Figure 5:
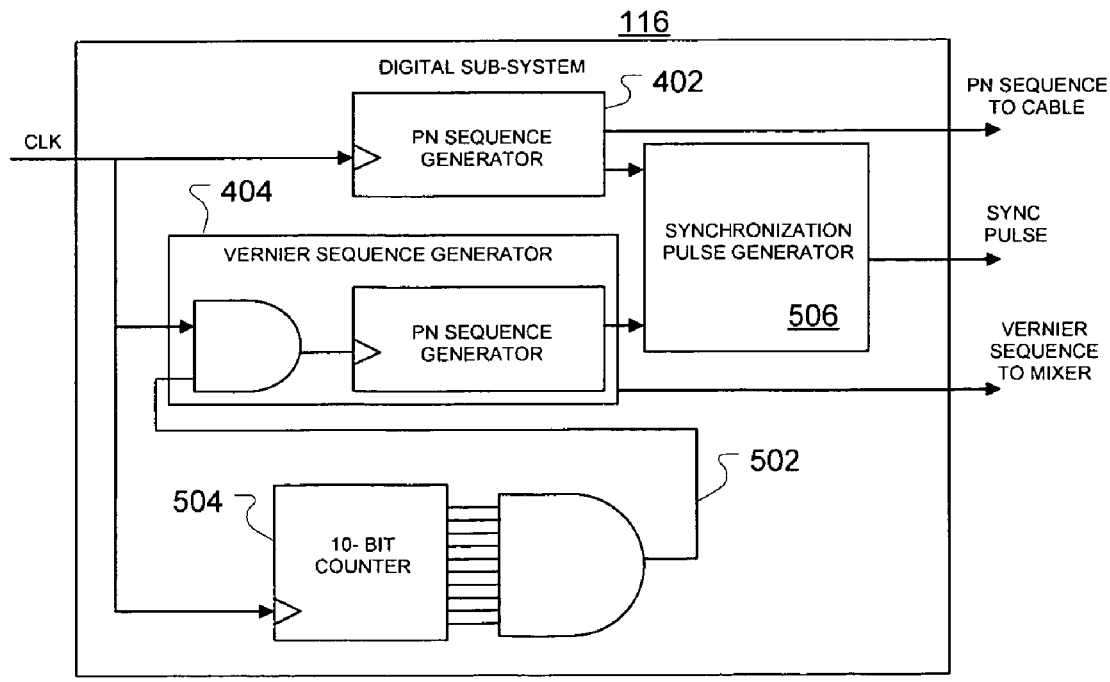
FIG. 5 is a detailed block diagram of the digital portion of the chip of FIG. 4.

FIG. 5 illustrates the digital portion of the chip in further detail. The PN sequence generator 402 is implemented using a 10-bit Linear Feedback Shift Register (LFSR) to provide a 1023 chip sequence. The Vernier sequence generator 404 is identical to the PN sequence generator, except that the clock input to the flip-flops of the LFSR is logically ANDed with a "stall" signal 502 generated by the 10-bit counter 504. This signal stalls the Vernier sequence generator for one clock cycle at the end of a sequence (repeating the last bit), and introduces a one-bit delay in the Vernier sequence each time the 1023-bit sequence is completed. Thus, the reference sequence is initially synchronized with the main PN sequence generator but lags by one bit after the sequence is repeated for the first time, then lags by two bits after the sequence is repeated the second time, and so on. Eventually, the Vernier sequence lags by 1023 bits and is once again synchronized with the PN sequence. In this way, the Vernier sequence generator repeatedly produces all possible integer chip delayed versions of the PN sequence. The Synchronization Pulse Generator 506 is implemented using an RS flip-flop which generates a pulse that stays high for one complete PN sequence duration when both the PN sequence and the Vernier sequence are aligned (i.e., zero relative delay).

Figure 6:
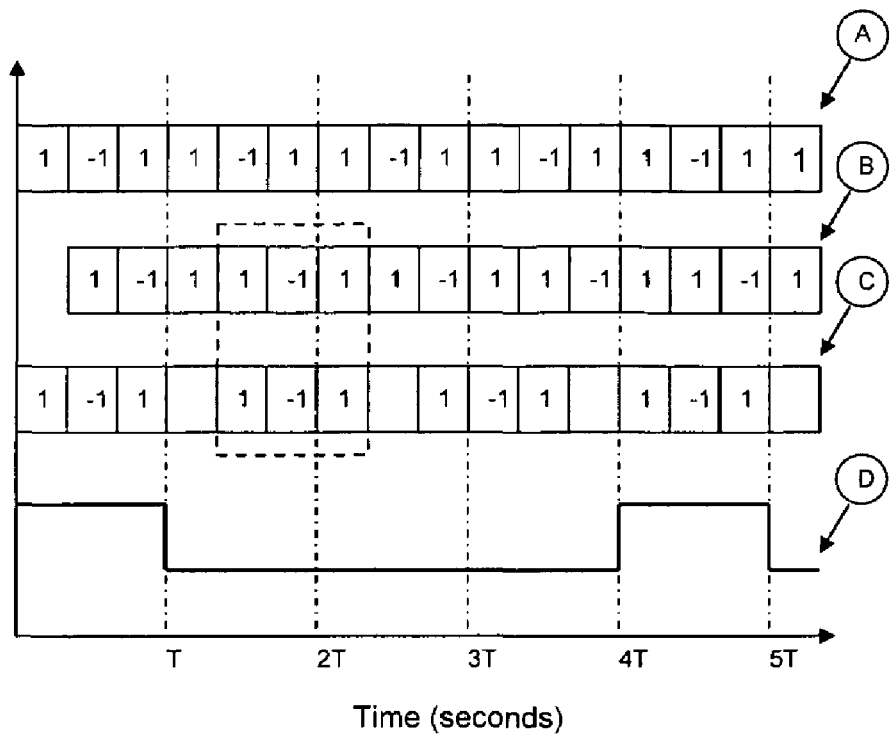
FIG. 6 is a timing operation providing exemplary waveforms corresponding to various points within the system of FIG. 4.

Returning to FIG. 1, operation of the chip will become more apparent from the timing diagram of FIG. 6 which illustrates exemplary waveforms corresponding to various points within the circuit as identified by the circles letters in FIG. 4. An illustrative example is providing using a PN sequence of length K=3, although the actual implementation uses a much longer PN sequence with K=1023. In the simplified example of FIG. 6, the PN signal consists of three bits: {1, −1, 1}. The PN sequence generator is capacitively coupled to the cable as shown in FIG. 4. Point C represents the output of the Vernier signal generator which is the same as the PN sequence, except that the last bit is repeated once at the end of the sequence. This additional bit is shown in gray in FIG. 6. Thus the Vernier signal is delayed by one bit each time the sequence is completed. (For example, the Vernier signal is delayed by one bit after the first sequence period, two bits after the second sequence period, and three bits after the third sequence period is completed.) It is aligned with the PN signal after the K+1 sequence repetitions, and the cycle begins again. Thus, the Vernier signal acts as the delayed version of the transmitted signal (delayed in steps of one bit) needed to compute the cross-correlation function $R_{SS}(\tau)$.

Point D represents the output of a Synchronous Pulse Generator block. As shown in FIG. 6, the output of this circuit remains high for one sequence length when both the PN and Vernier sequences are aligned in time. This alignment occurs after every K+1 sequences. The pulses generated by the Synchronous Pulse Generator provide the time reference for determining the delay between the initial (transmitted) signal and the reflected signal. The rising edge of the synchronization pulse denotes the beginning of the zero reference for the time axis of the correlator output. The delay between transmitted and reflected signal is proportional to the distance to the fault, and this distance can be determined using the known velocity of propagation on the line.

Point B shows the PN sequence reflected at the open-circuited end of the cable. In this example, we assume that the delay due to the attached cable is exactly one bit long. The dashed box in FIG. 6 shows that the reflected sequence is perfectly aligned with the second Vernier sequence which has a delay of one bit compared to the transmitted PN sequence. The magnitude of the correlation of the reflected sequence and Vernier sequence is maximum at this point of perfect alignment.

The time difference between the location of the correlation peak and the falling edge of the Synchronization (Sync) Pulse when normalized by time T (the period of the PN sequence) gives us the delay of the reflected PN signal on the cable ($\tau$). This delay ($\tau$) can be translated into the distance to the fault by noting that a one-bit delay in the reflected sequence is translated into a K-bit delay between the Sync Pulse and the point of maximum correlation. Thus, the correlator output signal can be sampled using a relatively slow (and thus low power) analog-to-digital converter. For example, a microprocessor 408 (FIG. 4) can include an analog-to-digital converter.

Although the chip repeats the reference sequence 1023 times, this is more than necessary for typical aircraft wires with a maximum length of 100 feet. For instance, if an input clock frequency of 100 MHz is used, then one chip of delay corresponds to d=3 feet of cable length. A 100 foot cable can be scanned by repeating the reference sequence 34 times. Longer delays are not necessary, since the cable is known to be limited in length. The reference sequence can thus be reset after generating all possible integer delays from 0 to 34, which covers the distance range of 0 to 100 feet of cable length.

Figure 7:
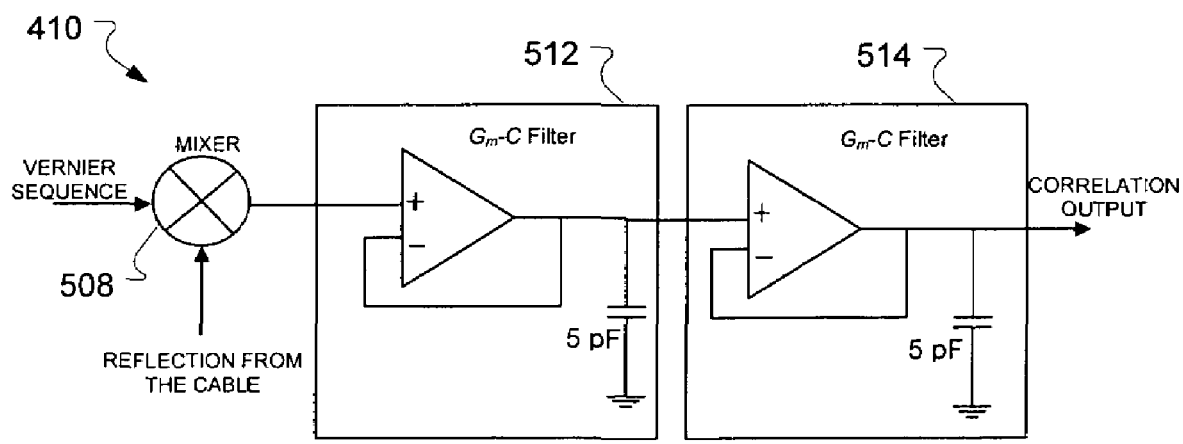
FIG. 7 is a detailed block diagram of the analog portion of the chip of FIG. 4.
Figure 8:
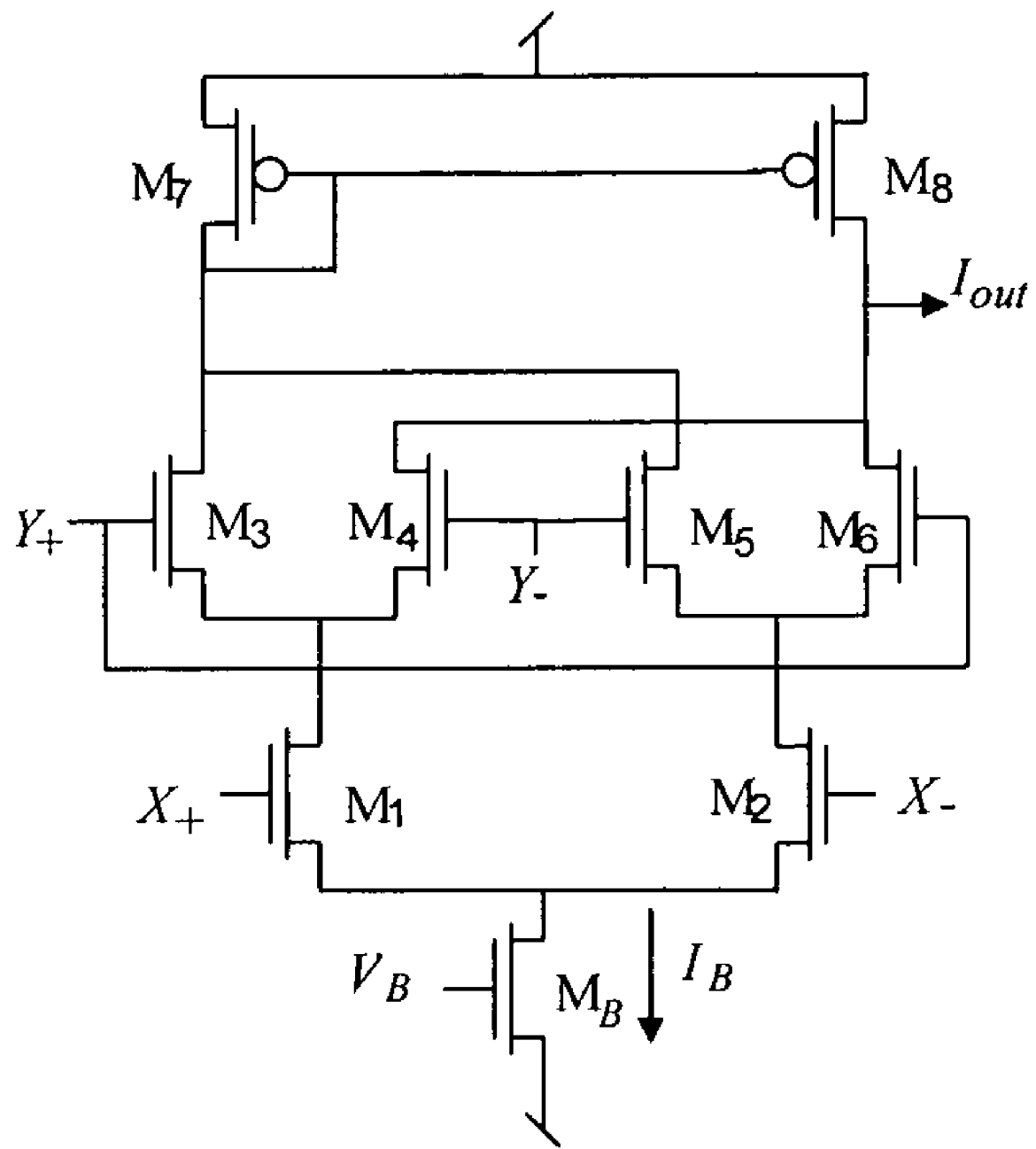
FIG. 8 is a detailed schematic of the mixer portion of FIG. 7.

FIG. 7 shows a block diagram of the analog portion of the chip which performs the correlation. The correlator 410 includes a mixer 508 to multiply the Vernier sequence and the reflected sequence together. Two first-order low pass Gm-C filters 512, 513 implement the time domain integrator 510 to provide the correlation output. A detailed schematic of the mixer is shown in FIG. 8. The mixer takes two differential voltage inputs X and Y. The output current $I_{out}$ is proportional to the product of the two differential input voltages. The sequence reflected from the end of the cable is applied to the X input, and the Vernier sequence is applied to the Y input. The $G_m$-C filter uses a current-mirror operational transconductance amplifier (OTA) whose transconductance ($G_m$) is adjustable by changing its bias current. By varying the $G_m$ of a filter, its cut-off frequency can be varied. The time constants of the integrator can be tuned by adjusting the amplifier bias current, which is controlled using off-chip resistors.

The resulting chip uses a total die area of 1.5×1.5 mm$^2$, but the total active circuitry area is only 0.192 mm$^2$. The digital sub-system consumes 80% of the layout area. The power consumed by the CMOS integrated circuit is 52.8 mW at 100 MHz clock speed. Out of this power, 12.9 mW is consumed in driving internal diagnostic signals off chip for testing. These signals would not be needed in a production version of the microchip, so the power used for the sensor can be reduced to 39.9 mW. Of the power consumed by the chip core, 35.7 mW is consumed by the digital circuitry and 4.2 mW is consumed by the analog circuitry.

The chip was tested on a custom-made printed circuit board using a clock frequency of 100 MHz. Thus, the width of one bit of the PN sequence is 10 ns, and the total 1023-bit PN sequence has a period of 10.23 μs. One bit of delay thus corresponds to d=3 feet of cable length.

Figure 9:
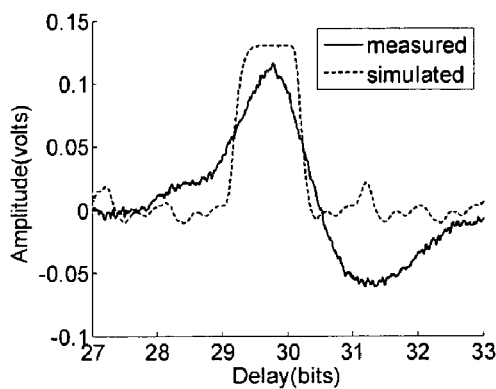
FIG. 9 is a graph showing simulated and measured results for the operation of a reflectometer in accordance with an embodiment of the present invention.

The exact shape of the correlation function depends on the time delay between the transmitted and reflected signals, as the following examples illustrate. FIG. 9 shows a simulated result (dashed line) and a measured result (solid line) for the case when the length of the open-circuited wire produces a delay of 29 bits (~87.75 feet) between the transmitted code and reflected code. (Note that it was not practical to fully simulate the circuit using SPICE simulation software due to the long simulation time required for the 1023-bit sequences. Hence a higher-level model using MATLAB simulation software was created to produce the simulation results shown here.)

The response signal may be attenuated. For ML sequences, the shape of correlation peak is triangular if an ideal integrator is used for correlation. The shape of correlation peak in FIG. 9 is rectangular because a first order IIR filter was used to realize a first order RC low pass filter (leaky integrator similar to one used on the integrated circuit) with a cut-off frequency equal 1/T (T is the period of the PN signal). Accordingly, the correlation is approximated relative to the theoretical mathematical definition of correlation. Moreover, in simulation it is assumed that there is no attenuation of the transmitted signal which is reflected back by the impedance discontinuity on the cable. Thus, the reflected signal is an unattenuated and time delayed copy of the transmitted signal. As the Vernier sequence shifts relative to the input into the cable, when the response and the Vernier signal start aligning, the RC low pass filter used in simulation reaches its maximum value (saturates) very quickly and hence the simulated shape of the correlation peak in FIG. 9 appears rectangular.

In practice, the reflected signal may be attenuated and have noise. For example, the measured output of the correlator in FIG. 9 exhibits undershoot, after the peak of correlation. This undershoot can be observed in STDR systems when capacitive coupling of the PN signal to the cable under test is used.

Figure 10:
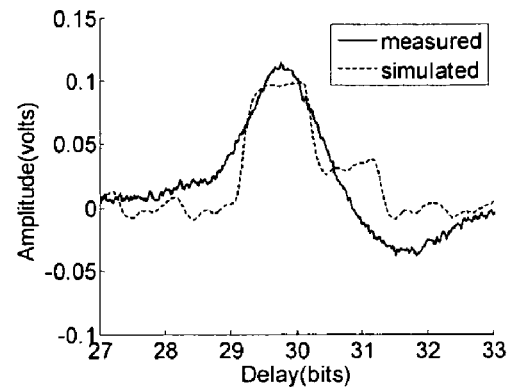
Figure 11:
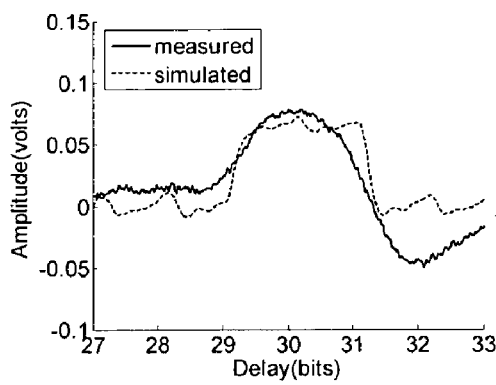
Figure 12:
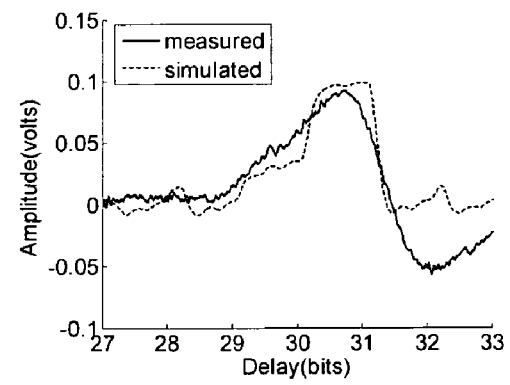
Figure 13:
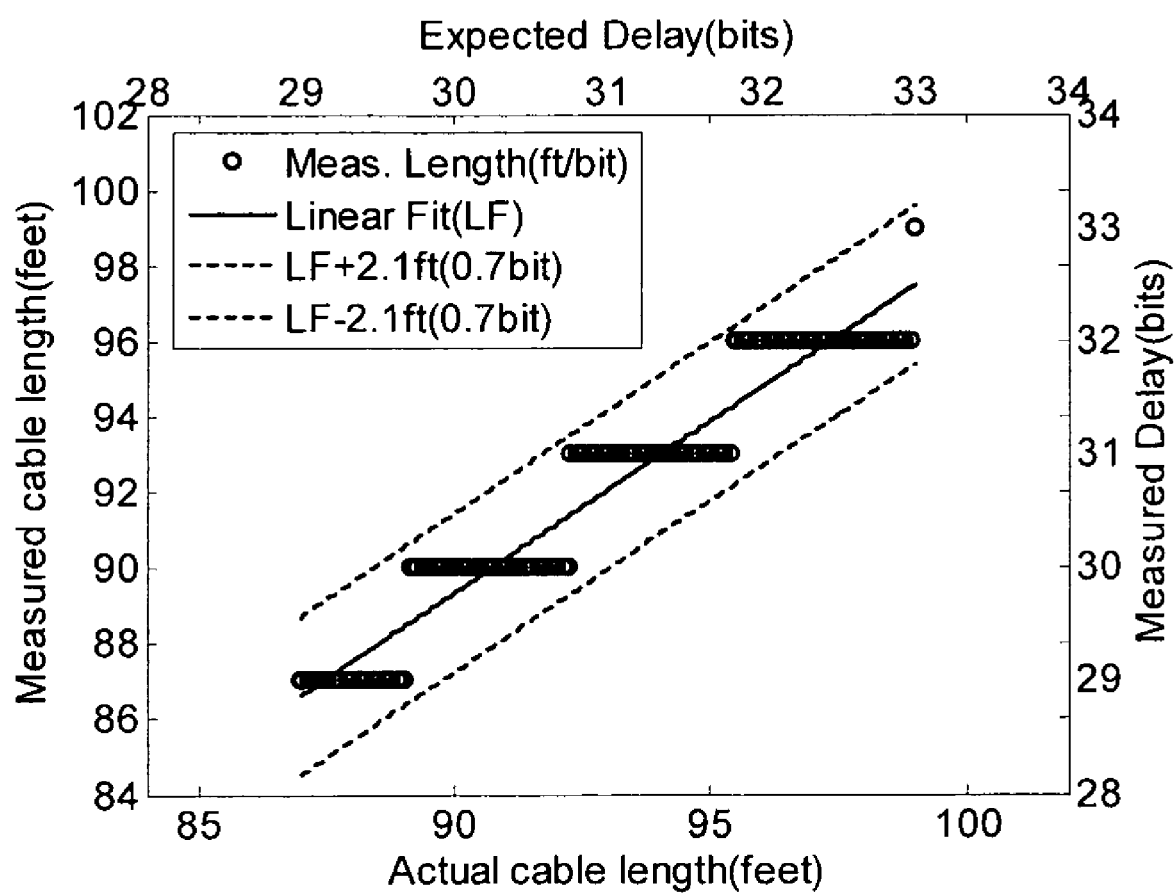
FIG. 13 shows the resulting fault location computed using simple peak detection in accordance with an embodiment of the present invention.

FIG. 10-FIG. 12 show simulated (dashed line) and measured (solid line) results for additional amounts of delay. FIG. 10 shows the correlation for a delay of 29.25 bits (88.5 feet), FIG. 11 a delay of 29.5 bits (89.25 feet), and FIG. 12 a delay of 29.75 bits (90 feet) respectively. Similar results occur for short circuits, but the correlation peaks are inverted. It can be seen that the shape of the correlation signal in each of FIGS. 9-12 is different. The simplest method for calculating distance to a fault in the cable is to simply measure the point where the correlation attains its highest value. FIG. 13 shows the fault location computed using simple peak detection in an experiment where an open-circuited cable was cut from a length of 99 feet to a length of 87 feet in steps of one inch. The distance to the fault was estimated by measuring the time between the Sync Pulse and the correlation peak from the chip.

The two dashed lines in FIG. 13 enclose the deviation of data from its expected value, indicating the error in determining the location of fault on the cable. Since the 100-MHz clock limits the measurement precision in the chip implementation, the error can be as large as 2.1 feet of from its expected value. The top and right axes in FIG. 13 show the delay in terms of the number of bits of the PN sequence. It assumes that one bit of delay equals 3 feet distance on the cable. As shown by the two dashed lines in FIG. 13, the error in determining the delay can be as large as 0.7 bit. Thus, determining the distance to a fault by measuring the position of the highest value of the correlation output may result in error as large as 0.7 bit (or 2.1 feet at 100 MHz).

The error can be reduced by utilizing the analog waveform information visible in the correlator signals of FIGS. 9-12. The relationship between the shape of the correlation output peak and the accuracy of fault location is used in the estimator to provide improved resolution in the delay estimate, which in turn provides improved accuracy in the distance estimate.

As noted above, the delay of the response signal can be an integral or partial number of chips. Thus the variable $\tau$ can assume any value. That is, $\tau$ is not constrained to be an integer multiple of the chip time $T_c$. The value of cross-correlation function $R_{SS'}(\tau)$ when the delay is not an integer multiple of one bit ($T_c$) is given by $$R_{ss'}(\tau) = \frac{1}{T}\sum_m \sum_n a_m a_n \int_0^T p(t - mT_c)p(t + \tau - nT_c)dt$$

This integral is nonzero when $p(t-mT_c)$ and $p(t+\tau-nT_c)$ overlap. The delay $\tau$ can be expressed as $\tau = kT_c + \tau_\phi$, where $0 \leq \tau_\phi < T_c$. Using this substitution, the pulses overlap only for $n=k+m$ and $n=k+m+1$, so that we can rewrite this as $$R_{ss'}(\tau) = R_{ss'}(k, \tau_\phi)$$
$$= \frac{1}{N}\sum_{m=0}^{N-1} a_m a_{k+m} \frac{1}{T_c}\int_0^{T_c-\tau_\phi} p(\lambda)p(\lambda + \tau_\phi)d\lambda +$$
$$\frac{1}{N}\sum_{m=0}^{N-1} a_m a_{k+m+1} \frac{1}{T_c}\int_{T_c-\tau_\phi}^{T_c} p(\lambda)p(\lambda - T_c + \tau_\phi)d\lambda$$

where the substitution $\lambda = t - mT_c$ has also been employed. The discrete periodic cross-correlation function of two codes $b_n$ and $b_n'$ is given by $$\theta_{bb'}(k) = \frac{1}{N}\sum_{n=0}^{N-1} a_n a'_{n+k}$$

where $a_n = 2 \cdot b_n - 1$. Using this definition, the cross-correlation function $R_{SS'}(\tau)$ becomes $$R_{ss'}(\tau) = R_{ss'}(k, \tau_\phi) = \left(1 - \frac{\tau_\phi}{T_c}\right)\theta_{bb'}(k) + \frac{\tau_\phi}{T_c}\theta_{bb'}(k+1)$$

This gives the relationship between the correlation output $R_{SS'}(\tau)$ in terms of the sub-bit (sub-chip) delay $\tau_\phi$ and the integer delay k. The location of the fault on the cable can be determined from the time delay observed when the correlation is maximum. Thus, although simple peak detection limits the accuracy of the solution to about 0.7 bit delay (or 2.1 feet at 100 MHz), using the shape of the sub-bit delayed correlations provides additional accuracy. This accuracy can be obtained efficiently with simple digital hardware, as follows.

The correlation output is sampled with a frequency of $1/(T+(T/K))$, where T is the period of K bit long PN sequence. Three samples centered in time around the correlation peak are stored in the internal registers of a microprocessor that is digitizing the analog correlator output of the chip. The second sample is the highest valued (maximum) sample, the first sample is T+(T/K) seconds before, and the third sample is T+(T/K), seconds after.

Sub-bit fault location accuracy can be obtained using the following algorithm:
1) Normalize all three samples by the magnitude of the highest sample (i.e., the second sample).
2) Compare the normalized magnitudes of the first and third samples. Assign the greater magnitude to a variable h.
3) If the first sample is greater than the third sample, then subtract (h/1+h) from the delay of the highest valued sample.
4) If third sample is greater than the first sample, then add (h/1+h) to the delay of the highest valued sample.

For a short circuit condition the algorithm is the same, except that the minimum value is used rather than the maximum, and values are compared to see which one is less than the other.

Whether the fault is an open or a short can be determined by looking at the ratio of the maximum valued sample to the minimum valued sample. If this ratio is less than or equal to one, the fault is a short circuit; if it is greater than one, it is an open circuit.

Figure 14:
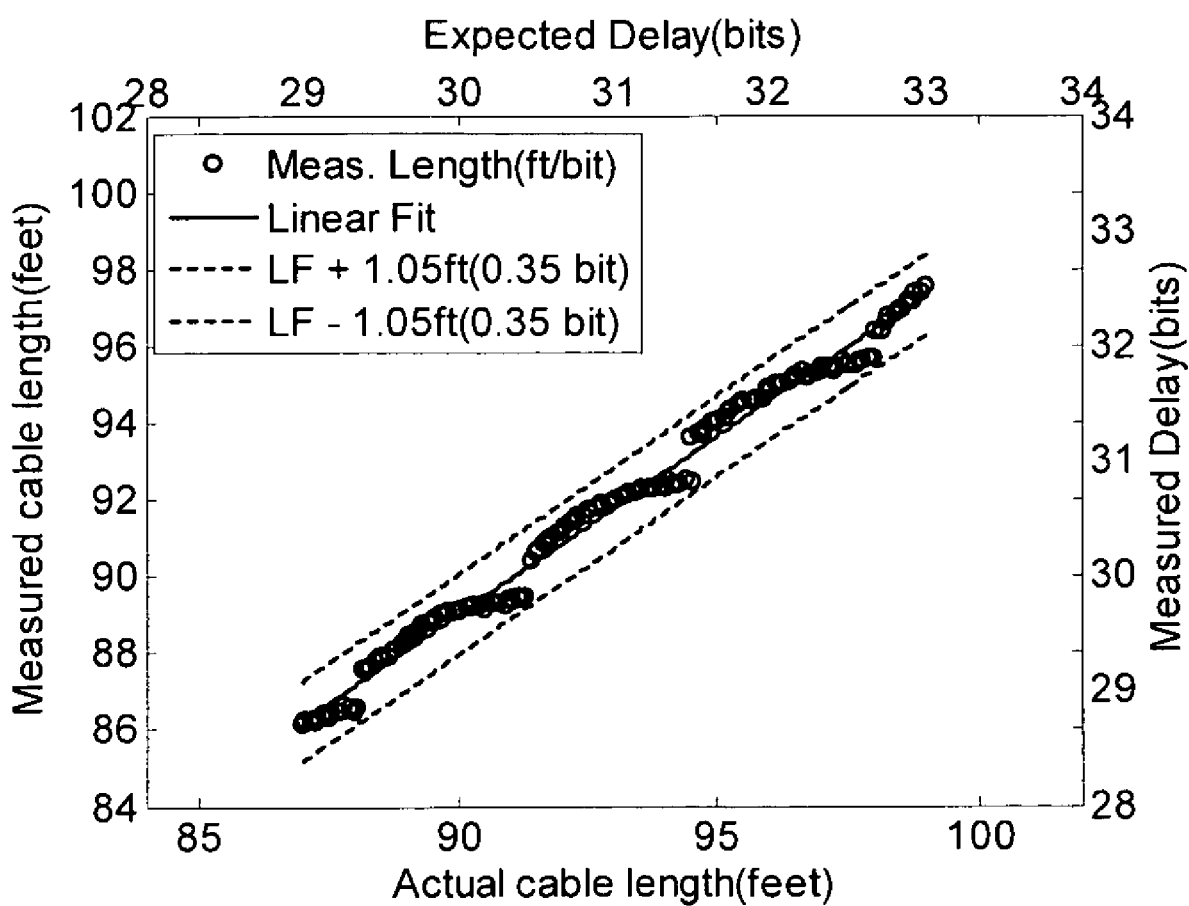
FIG. 14 shows the resulting fault location computed using estimation taking into account the shape of the correlation in accordance with an embodiment of the present invention.

FIG. 14 shows the fault location estimated from the output of the chip by taking the shape of correlation simple peak into account for an open-circuit cable cut from 99 feet to 87 feet in steps of one inch. The two dashed lines in FIG. 14 enclose the deviation of data from its expected value, indicating the error in determining the location of fault on the cable. The maximum error observed was 1.05 feet. The top and right axes in FIG. 14 show the delay in terms of the number of bits of the PN sequence. It assumes that one bit of delay equals 3 feet distance on the cable. As shown by the two dashed lines in FIG. 14, the error in determining the delay can be as large as 0.35 bit. Thus, there is an improvement by a factor of two over simple peak detection when the sub-bit delays are taken into account using this algorithm. Additional improvement may be obtained with better fit between the algorithm and sub-bit delay pulse shape.

The estimation can be performed by the microprocessor 408 (FIG. 4). For example, the microprocessor can include an analog-to-digital converter to sample the correlation function. Although the digital portion operates at high rate (e.g., 100 MHz), the correlation samples are obtained at a fraction of this rate. For example, for the code length of 1023, correlation samples are obtained every 1024 clocks, or at a rate of about 97.7 kHz. Hence, the audio-frequency rate analog to digital conversion can be performed in the chip implementation. The processor analyzes the shape of the correlation peak to account for sub-chip delay, increasing the accuracy of the fault location.

Figure 15:
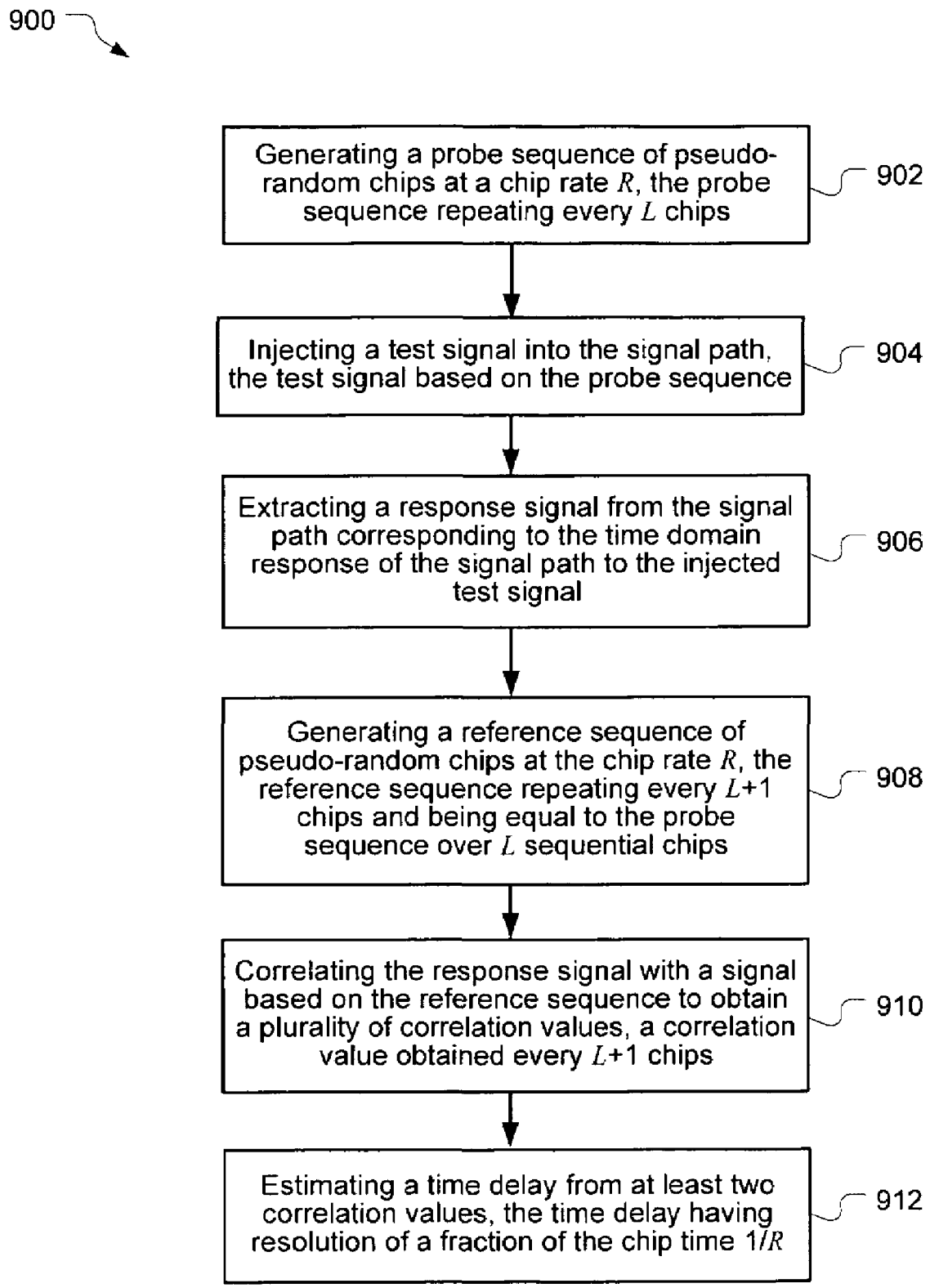
FIG. 15 is a flow chart of a method of reflectometry testing a signal path, in accordance with an embodiment of the present invention.

Finally, a flow chart of a method of reflectometry testing a signal path is illustrated in FIG. 15, in accordance with an embodiment of the present invention. The method, shown generally at 900, includes the steps of generating 902 a probe sequence of pseudo-random chips and generating 908 a reference sequence of pseudo-random chips. The probe sequence and the reference sequence are both generated at the chip rate R. The probe sequence and the reference sequence are equal to each other over L sequential chips. In other words, the reference sequence has one extra chip at either the end or the beginning relative to the probe sequence. The value of the extra first chip is not important, and it can be set equal to any value that is convenient in the implementation. Various ways of generating the probe sequence and the reference sequence are described above.

Additional steps of the method 900 include the steps of injecting 904 a test signal into the signal path, and extracting 906 a response signal from the signal path. The test signal is based on the probe sequence. For example, the test signal may be the probe sequence or a modified version of the probe sequence (e.g., frequency-translated, amplified, attenuated, or filtered). The response signal from the signal path is the time domain response of the signal path to the injected test signal. Various ways of injecting the test signal and extracting the response signal are described above.

The method 900 also includes the step of correlating 910 the response signal with a signal based on the reference sequence to obtain a plurality of correlation values, and estimating 912 a time delay from at least two correlation values. The correlation values are obtained every L+1 chip times, since the correlation interval corresponds to the L chip portion of the reference sequence. The time delay is estimated from at least two of the correlation values to provide a time delay having a resolution of a fraction of the chip time. For example, the time delay can be determined from a local extremum using interpolation as described above. Multiple local extremum may be used to provide multiple time delay outputs as described above. The time delay(s) can be expressed as an integer part in whole chip times and a fractional part of a chip time.

Summarizing and reiterating to some extent, it will be appreciated by those skilled in the art that the disclosed reflectometry techniques are readily implemented in a physically compact system. For example, the system can be included on a single monolithic integrated circuit. Clock rate operation can be maintained at a relatively low frequency, since multiple samples per chip time are not needed. Conversely, high resolution can be obtained by using interpolation and/or pattern matching techniques to obtain sub-chip time resolution in the delay time corresponding to peaks of the correlation. By maintaining low clock rates, low power consumption can be obtained. This can enhance the ability to integrate reflectometry testing as described into an operational system, providing "in-flight" testing capability. For example, a reflectometry system may be included within handheld test equipment, equipment boxes, junction boxes, circuit breakers, or even connectors. It can be integrated onto other circuit boards, or as a stand-alone component. Multiple sensors can be integrated within a single integrated circuit. Low power consumption may enable the reflectometry system to scavenge power from the operational circuits within the operational system, avoiding the need for cumbersome power supplies or batteries. Reflectometry systems as described herein may also be included in the circuitry of new operational systems being designed.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein. Accordingly, it is not intended that the invention be limited except by the claims set forth below.

What is claimed is:

1. A system for reflectometry testing of a signal path, comprising:
   a system clock configured to output a clock at a chip rate;
   a pseudo-noise generator coupled to the system clock and configured to output a probe sequence of pseudo-random chips at the chip rate, wherein the sequence repeats every L chips;
   a sliding pseudo-noise generator coupled to the system clock and configured to output a reference sequence at the chip rate, wherein the reference sequence repeats every L+1 chips and the reference sequence is equal to the probe sequence over a continuous segment of length L chips;
   a signal path interface coupled to the pseudo-noise generator and configured to inject the probe sequence into the signal path and obtain a resulting response signal from the signal path;
   a correlator coupled to the signal path interface and the sliding pseudo-noise generator and configured to determine a correlation of the response signal and the reference sequence and output samples of the correlation at intervals of L+1 chips; and
   an estimator coupled to the correlator and configured to estimate a peak correlation delay time from at least two of the samples of the correlation, wherein the peak correlation delay time includes an integer chip number portion and a fractional chip number portion.

2. The system of claim 1 wherein the pseudo-noise generator, sliding pseudo-noise generator, correlator, and estimator are all implemented on a monolithic integrated circuit.

3. The system of claim 1 wherein the system is integrated into an operational system.

4. The system of claim 1 wherein the correlator and estimator operate at the chip rate.

5. The system of claim 1 wherein the pseudo-noise generator comprises a linear feedback shift register.

6. The system of claim 1 wherein the signal path interface comprises a signal coupler selected from the group consisting of a direct connection, a series connected capacitor, a series connected inductor, a capacitive coupler, an inductive coupler, and a directional coupler.

7. The system of claim 1 wherein the signal path interface comprises an injection portion and an extraction portion.

8. The system of claim 1 wherein the signal path interface comprises a modulator configured to modulate the probe pseudo-noise sequence by carrier frequency prior to injection into the signal path.

9. The system of claim 8 wherein the signal path interface comprises a demodulator configured to demodulate the response signal before correlation with the reference pseudo-noise sequence.

10. The system of claim 8 wherein the sliding pseudo-noise generator comprises a modulator configured to modulate the reference pseudo-noise sequence by the carrier frequency before correlation with the resulting response signal.

11. The system of claim 1 wherein the response signal includes a superimposed operational signal present within the signal path.

12. The system of claim 1 wherein the correlator comprises:
a mixer configured to multiply the response signal and the reference pseudo-noise sequence to form a product; and
a filter coupled to the mixer and configured to filter the product and output the correlation.

13. The system of claim 12 wherein the mixer is a Gilbert-cell mixer.

14. The system of claim 12 wherein the filter is a Gm-C filter.

15. The system of claim 12 wherein the filer is a passive RC filter.

16. The system of claim 1 wherein the estimator comprises a linear interpolator configured to determine a fractional chip number portion of the peak correlation delay time from an extremum correlation value and an adjacent correlation value offset from the extremum correlation value by a one chip delay.

17. The system of claim 1 wherein the estimator comprises an interpolator matched to the correlation pulse shape.

18. A system for reflectometry testing of a signal path, comprising:
means for generating a probe sequence at a chip rate, the probe sequence being a pseudo-noise sequence which repeats every L chips;
means for generating a reference pseudo-noise sequence at the chip rate, the reference pseudo-noise sequence being equal to the probe pseudo-noise sequence over a segment of length L chips and repeating every L+1 chips;
means for injecting the probe sequence into a signal path;
means for obtaining a response of the signal path to the probe pseudo-noise sequence;
means for estimating a correlation of the response of the signal path with the reference sequence to obtain a correlation function at a plurality of samples; and
means for estimating a time delay corresponding to a peak of the correlation function, wherein the time delay has an integer chip number portion and a fractional chip number portion.

19. The system of claim 18, wherein the means for injecting the probe pseudo-noise sequence comprises means for frequency-translating the probe pseudo-noise sequence to a carrier frequency.

20. The system of claim 18, wherein the means for obtaining a response of the signal path comprises means for frequency-translating the response of the signal path to baseband.

21. The system of claim 18, wherein the means for estimating the correlation comprises:
means for multiplying the response of the signal path and the reference pseudo-noise sequence to obtain a product;
means for integrating the product to obtain the correlation function.

22. The system of claim 18, wherein the means for estimating a time delay comprises means for interpolating the correlation function to obtain a fractional chip number portion.

23. A method of reflectometry testing a signal path comprising:
generating a probe sequence of pseudo-random chips at a chip rate R, the probe sequence repeating every L chips;
injecting a test signal into the signal path, the test signal based on the probe sequence;
extracting a response signal from the signal path corresponding to the time domain response of the signal path to the injected test signal;
generating a reference sequence of pseudo-random chips at the chip rate R, the reference sequence repeating every L+1 chips and being equal to the probe sequence over L sequential chips;
correlating the response signal with a signal based on the reference sequence to obtain a plurality of correlation values, a correlation value obtained every L+1 chips; and
estimating a time delay from at least two correlation values, the time delay having resolution of a fraction of the chip time 1/R.

24. The method of claim 23 wherein:
generating a probe sequence of pseudo-random chips comprises clocking a first linear feedback shift register every 1/R references; and
generating a reference sequence of pseudo-random chips comprises clocking a reference linear feedback shift register repeatedly L+1 times, where L clocks are at intervals of 1/R and 1 clock is at an interval of 2/R, and the first linear feedback shift register and reference linear feedback shift register have the same feedback.

25. The method of claim 23 wherein injecting a test signal into the signal path comprises modifying the test signal using a function selected from the group consisting of frequency-shifting, amplifying, attenuating, and filtering.

26. The method of claim 23 wherein extracting a response signal from the signal path comprises modifying the response signal using a function selected from the group consisting of frequency-shifting, amplifying, attenuating, and filtering.

27. The method of claim 23 wherein estimating a time delay comprises estimating a plurality of time delays corresponding to multiple local extrema of the correlation values.

28. The method of claim 23 wherein estimating a time delay comprises interpolating between a local extremum of the correlation values and at least one adjacent correlation value.

29. The method of claim 23 wherein estimating a time delay comprises:
finding a local extremum $x_m$ of the correlation values, where m is the integer chip time delay corresponding to the local extremum;
finding the larger $x_n$ of the immediately adjacent correlation values $x_{m+1}$ and $x_{m-1}$;
setting the time delay equal to $m+((x_n/x_m)/(1+x_n/x_m))$ when $x_{m+1} > x_{m-1}$; and
setting the time delay equal to $m-((x_n/x_m)/(1+x_n/x_m))$ when $x_{m+1} < x_{m-1}$.

30. The method of claim 23 wherein estimating a time delay comprises comparing at least two of the correlation values to a plurality of correlation pattern templates to determine a fractional chip time delay.

* * * * *